(12) United States Patent
Wang

(10) Patent No.: US 12,476,554 B2
(45) Date of Patent: Nov. 18, 2025

(54) SYNCHRONOUS RECTIFICATION ASSEMBLY, MANUFACTURING METHOD THEREOF AND POWER SUPPLY

(71) Applicant: Aplus Power Technology (Hangzhou) Co., Ltd., Hangzhou (CN)

(72) Inventor: Yuetian Wang, Hangzhou (CN)

(73) Assignee: Aplus Power Technology (Hangzhou) Co., Ltd., Hangzhou (CN)

( * ) Notice: Subject to any disclaimer, the term of this patent is extended or adjusted under 35 U.S.C. 154(b) by 383 days.

(21) Appl. No.: 18/060,423

(22) Filed: Nov. 30, 2022

(65) Prior Publication Data
US 2023/0170819 A1    Jun. 1, 2023

(30) Foreign Application Priority Data

Nov. 30, 2021   (CN) .......................... 202111447685.0

(51) Int. Cl.
*H05K 1/02*  (2006.01)
*H01F 27/06*  (2006.01)
(Continued)

(52) U.S. Cl.
CPC ............ *H02M 7/003* (2013.01); *H01F 27/28* (2013.01); *H05K 1/11* (2013.01); *H05K 1/181* (2013.01);
(Continued)

(58) Field of Classification Search
CPC .......... H05K 1/02; H05K 1/0242; H05K 1/11; H05K 1/111; H05K 1/144; H05K 1/145;
(Continued)

(56) References Cited

U.S. PATENT DOCUMENTS

| 5,663,635 | A | 9/1997 | Vinciarelli et al. |
| 8,564,394 | B2* | 10/2013 | Li .................. H05K 7/1432 |
| | | | 336/200 |

(Continued)

FOREIGN PATENT DOCUMENTS

| CN | 101296599 A | 10/2008 |
| CN | 101399490 A | 4/2009 |

(Continued)

OTHER PUBLICATIONS

First Office Action and search report issued on Aug. 16, 2023 for counterpart Chinese patent application No. 202111447685.0, along with machine EN translation.

(Continued)

*Primary Examiner* — Xiaoliang Chen
(74) *Attorney, Agent, or Firm* — Hamilton, Brook, Smith & Reynolds, P.C.

(57) ABSTRACT

The present application provides a synchronous rectification assembly, a manufacturing method thereof and a power supply. The synchronous rectification assembly comprises a synchronous rectification board, a transformer and a main board; wherein the synchronous rectification board is disposed on the main board and is electrically connected to the main board, and the transformer is disposed on the synchronous rectification board and is electrically connected to the synchronous rectification board; the synchronous rectification board is provided with a conductive contact for being electrically connected to an external apparatus, and the synchronous rectification board is used for synchronously rectifying an output signal of the transformer and thereafter transmitting the output signal to the conductive contact. The present application can solve the problem that the output signal outputted by the transformer in the existing synchro- (Continued)

nous rectification assembly has a large loss during transmission.

12 Claims, 3 Drawing Sheets

(51) Int. Cl.
| | |
|---|---|
| H01F 27/08 | (2006.01) |
| H01F 27/22 | (2006.01) |
| H01F 27/28 | (2006.01) |
| H01F 27/29 | (2006.01) |
| H01F 27/34 | (2006.01) |
| H01F 27/40 | (2006.01) |
| H02M 7/00 | (2006.01) |
| H05K 1/11 | (2006.01) |
| H05K 1/18 | (2006.01) |

(52) U.S. Cl.
CPC .......... H05K 2201/1003 (2013.01); H05K 2201/10053 (2013.01)

(58) Field of Classification Search
CPC ...... H05K 1/165; H05K 1/181; H05K 3/3494; H02M 3/003; H02M 3/285; H02M 3/3353; H02M 3/33573; H02M 3/33576; H02M 7/0003; H01F 27/06; H01F 27/08; H01F 27/085; H01F 27/22; H01F 27/28; H01F 27/29; H01F 27/34; H01F 27/40; H01F 27/266; H01F 27/292; H01F 27/306; H01F 27/2804; H01F 27/2847; H01F 27/2852
USPC ............ 361/760, 767, 771, 782; 336/65, 83; 363/21.06; 29/832; 331/67, 167
See application file for complete search history.

(56) References Cited

U.S. PATENT DOCUMENTS

| | | | |
|---|---|---|---|
| 8,964,410 | B2 | 2/2015 | Chang et al. |
| 10,243,449 | B1 | 3/2019 | Young |
| 10,881,773 | B2* | 1/2021 | Rudser .................. H02J 50/10 |
| 10,931,206 | B2* | 2/2021 | Yamada ................ H02M 7/003 |
| 12,200,867 | B2 | 1/2025 | Wang |
| 2005/0083665 | A1* | 4/2005 | Nakashima ............ H05K 1/181 |
| | | | 361/767 |
| 2005/0189566 | A1* | 9/2005 | Matsumoto ............ H05K 3/368 |
| | | | 257/200 |
| 2006/0034109 | A1 | 2/2006 | Benabdelaziz et al. |
| 2007/0152795 | A1 | 7/2007 | Zeng et al. |
| 2008/0074204 | A1* | 3/2008 | Ichikawa ............. H03B 5/1876 |
| | | | 331/67 |
| 2008/0076484 | A1* | 3/2008 | Veselic ..................... G06F 1/26 |
| | | | 455/572 |
| 2009/0045897 | A1* | 2/2009 | Yang ...................... H01F 30/06 |
| | | | 336/83 |
| 2009/0309684 | A1 | 12/2009 | Tsai et al. |
| 2010/0033282 | A1* | 2/2010 | Hsu ........................ H05K 1/141 |
| | | | 336/65 |
| 2010/0045590 | A1* | 2/2010 | Kumamoto ........ H05B 41/2827 |
| | | | 345/102 |
| 2011/0032683 | A1* | 2/2011 | Li ...................... H02M 3/33592 |
| | | | 361/760 |
| 2011/0127833 | A1 | 6/2011 | Wu et al. |
| 2012/0099288 | A1* | 4/2012 | Parish ..................... H05K 1/145 |
| | | | 29/832 |
| 2013/0188329 | A1 | 7/2013 | Chang et al. |
| 2014/0169042 | A1* | 6/2014 | Eguchi ................ H02M 3/3353 |
| | | | 363/21.06 |
| 2015/0078042 | A1* | 3/2015 | Standing ................. H02M 7/06 |
| | | | 363/67 |
| 2018/0191263 | A1* | 7/2018 | Chida ............... H02M 3/33573 |
| 2018/0197673 | A1* | 7/2018 | Njiende ..................... H01F 3/10 |
| 2018/0205323 | A1* | 7/2018 | Cai ......................... H01F 27/29 |
| 2019/0076587 | A1* | 3/2019 | Rudser .................... H02J 50/70 |
| 2019/0122806 | A1 | 4/2019 | Chou et al. |
| 2019/0140551 | A1* | 5/2019 | Lu .......................... H05K 1/141 |
| 2019/0148061 | A1 | 5/2019 | Lu et al. |
| 2019/0378645 | A1* | 12/2019 | Chiang ............... H01F 27/2847 |
| 2020/0153178 | A1* | 5/2020 | Zhang .................... H01R 24/30 |
| 2020/0320966 | A1* | 10/2020 | Clark ..................... G10H 1/344 |
| 2021/0134520 | A1* | 5/2021 | Koki ..................... H02M 7/217 |
| 2021/0272737 | A1* | 9/2021 | Jin ........................ H05K 1/181 |
| 2021/0305907 | A1 | 9/2021 | Dong et al. |
| 2021/0315112 | A1* | 10/2021 | Song ..................... H02M 7/003 |
| 2022/0037074 | A1* | 2/2022 | Tashiro ............. H02M 3/33576 |
| 2023/0170820 | A1 | 6/2023 | Wang |
| 2023/0171892 | A1 | 6/2023 | Wang |
| 2024/0038441 | A1 | 2/2024 | Jiang et al. |
| 2024/0055985 | A1 | 2/2024 | Wang |
| 2024/0072646 | A1 | 2/2024 | Wang |

FOREIGN PATENT DOCUMENTS

| | | |
|---|---|---|
| CN | 102881405 A | 1/2013 |
| CN | 103973097 A | 8/2014 |
| CN | 104749426 A | 7/2015 |
| CN | 105099131 A | 11/2015 |
| CN | 105099160 A | 11/2015 |
| CN | 206388585 U | 8/2017 |
| CN | 107147094 A | 9/2017 |
| CN | 107210681 A | 9/2017 |
| CN | 207459970 U | 6/2018 |
| CN | 108667337 A | 10/2018 |
| CN | 109787484 A | 5/2019 |
| CN | 209516901 U | 10/2019 |
| CN | 212659384 U | 3/2021 |
| CN | 212936301 U | 4/2021 |
| CN | 213305278 U | 5/2021 |
| CN | 214101195 U | 8/2021 |
| CN | 112104201 A | 9/2021 |
| CN | 113452271 A | 9/2021 |
| CN | 214154343 U | 9/2021 |
| CN | 214626409 U | 11/2021 |
| CN | 113938019 A | 1/2022 |
| EP | 1626493 A1 | 2/2006 |
| JP | 2011087367 A | 4/2011 |
| WO | 2008/149530 A1 | 12/2008 |

OTHER PUBLICATIONS

Ex Parte Quayle Action received for U.S. Appl. No. 18/060,450, mailed on Aug. 12, 2024, 6 pages.
First Office Action and search report issued on Aug. 16, 2023 for counterpart Chinese patent application No. 202111447674.2, along with machine EN translation.
Notice of Allowance received for U.S. Appl. No. 18/060,450, mailed on Oct. 23, 2024 , 7 pages.
Galkin, I. et al., "Selection of Power Factor Corrector for Modular Uninterruptable Power Supply System," 14th International Power Electronics and Motion Control Conference, EPE-PEMC 2010, 5 pages (2010).
English translation of CN-113938019-A. (Year: 2022).
Mingyang et al., "Method for Realizing DC Output of Wind Turbine Based on Diode Rectifier", High Voltage Engineering, vol. 47, No. 8, Aug. 31, 2021, 13 pages.

* cited by examiner

SYNCHRONOUS RECTIFICATION ASSEMBLY, MANUFACTURING METHOD THEREOF AND POWER SUPPLY

RELATED APPLICATION(S)

This application claims priority under 35 U.S.C. § 119 or 365 to Chinese Application No. 202111447685.0, filed Nov. 30, 2021. The entire teachings of the above application are incorporated herein by reference.

TECHNICAL FIELD

The present application relates to the technical field of a synchronous rectification device, in particular to a synchronous rectification assembly, a manufacturing method thereof and a power supply.

BACKGROUND

At present, the power supply of an external apparatus (e.g., a server PC) with the structure of a conductive contact (golden finger) has the advantages of simple and convenient maintenance process and improved work efficiency of the staff. Since the conductive contact needs to be in plug-in electrical connection to the corresponding position of the external apparatus, it needs to be provided at a certain height, so that the conductive contact is not in the same plane as the main board of the power supply, and a printed circuit board (PCB board) needs to be provided as a carrier of the conductive contact, namely, a golden finger board. When a synchronous rectification module of the power supply is provided, generally a secondary side of a transformer is connected to a synchronous rectification board, then the synchronous rectification board is welded to a power supply main board, and then the power supply main board and the golden finger board are connected together via a connection piece. The output signal outputted from the transformer needs to be transmitted to the golden finger board through the power supply main board, and then the output signal is transmitted to the external apparatus through the conductive contact of the golden finger board.

SUMMARY

It is an object of the present application to provide a synchronous rectification assembly, so as to solve the problem that the output signal outputted by the transformer in the existing synchronous rectification assembly has a large loss during transmission. It is another object of the present application to provide a manufacturing method of a synchronous rectification assembly. It is a further object of the present application to provide a power supply.

In order to achieve the above objects, an aspect of the present application discloses a synchronous rectification assembly, comprising a synchronous rectification board, a transformer and a main board;
wherein the synchronous rectification board is disposed on the main board and is electrically connected to the main board, and the transformer is disposed on the synchronous rectification board and is electrically connected to the synchronous rectification board;
the synchronous rectification board is provided with a conductive contact for being electrically connected to an external apparatus, and the synchronous rectification board is used for synchronously rectifying an output signal of the transformer and thereafter transmitting the output signal to the conductive contact.

Alternatively, the transformer comprises a primary side assembly and a secondary side assembly, the secondary side assembly includes a plurality of secondary side windings, and the plurality of secondary side windings are electrically connected to the synchronous rectification board.

Alternatively, each of the secondary side assemblies comprises a pin, and a metal hole corresponding to each of the pins is formed on the synchronous rectification board;
the pins are in plug-in electrical connection to the corresponding metal holes on the synchronous rectification board.

Alternatively, the pin of the secondary side assembly of the transformer is inserted into the metal hole on the synchronous rectification board from the lower direction of the transformer, to be electrically connected to the metal hole.

Alternatively, the secondary side winding includes a center tap.

Alternatively, the primary side winding and the secondary side winding are in plural, and the primary side winding and the secondary side winding are arranged alternately.

Alternatively, the number of the primary side winding and the secondary side winding is more than three.

Alternatively, the main board is provided with a resonant circuit, and the primary side assembly of the transformer is electrically connected to the resonant circuit.

Alternatively, the synchronous rectification board is provided with a switching device.

Alternatively, the synchronous rectification board is arranged in parallel to the main board.

Alternatively, the main board is a power supply main board.

The present application further discloses a manufacturing method of a synchronous rectification assembly, comprising:
providing a transformer on a synchronous rectification board and electrically connecting the transformer to the synchronous rectification board, wherein the synchronous rectification board is provided with a conductive contact for being electrically connected to an external apparatus, and the synchronous rectification board is used for synchronously rectifying an output signal of the transformer and thereafter transmitting the output signal to the conductive contact;
providing the synchronous rectification board on the main board and electrically connecting the synchronous rectification board to the main board.

The present application further discloses a power supply comprising a synchronous rectification assembly as described above.

In the synchronous rectification assembly of the present application, the transformer is provided on the synchronous rectification board, and the synchronous rectification board is provided on the power supply main board. Wherein the synchronous rectification board is provided with a conductive contact for being electrically connected to an external apparatus. Moreover, the synchronous rectification board may further perform synchronous rectification on the output signal output by the transformer, and transmit the synchronously rectified signal to the external apparatus through the conductive contact on the synchronous rectification board. Thus, the output signal output by the transformer in the present application is rectified by the synchronous rectification board and then directly transmitted through the synchronous rectification board to the conductive contact thereon. That is, the output signal of the transformer can be output to the external apparatus only through the processing and transmission of the synchronous rectification board, and does not need to be transmitted to the conductive contact on the golden finger board through the power supply main board. Therefore, in the present application, the output signal outputted by the transformer is transmitted to the conductive contact in a shorter transmission path, which greatly shortens the transmission path of the output signal with large current and effectively reduces the energy loss of the output signal in the transmission process. Furthermore, in the synchronous rectification assembly of the present application, the conductive contact is provided on the synchronous rectification board, so that it is unnecessary to separately provide the golden finger board, and the number of circuit board adopted in the present application is less, the cost and structural complexity of the synchronous rectification assembly can be reduced, the process difficulty and the installation steps can be reduced.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

To illustrate more clearly the embodiments of the present application or the technical schemes of the prior art, a brief description of the accompanying drawings in the embodiments or the prior art will be given below. Obviously, the accompanying drawings described below are only some embodiments described in this application. For those of ordinary skill in the art, other drawings can also be obtained without any creative labor from these drawings.

Figure 1:
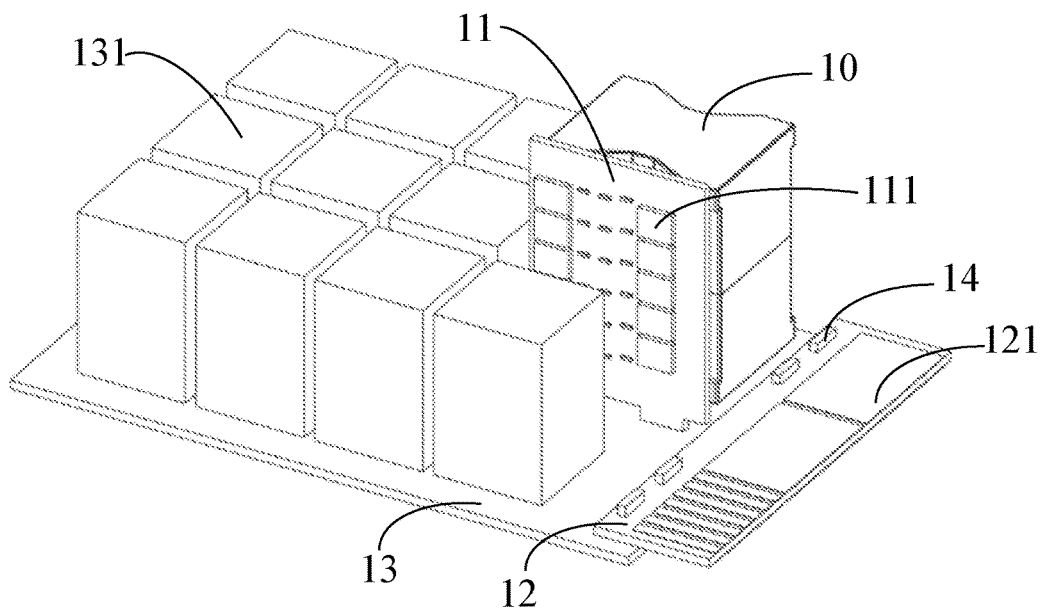
FIG. 1 shows a schematic diagram of a synchronous rectification assembly in the prior art.

REFERENCE SIGNS 10. transformer; 11. synchronous rectification board; 111. switching device; 12. golden finger board; 121. conductive contact; 13. power supply main board; 131. electronic element; 14. connection piece;
20. transformer; 21. synchronous rectification board; 211. conductive contact; 212. switching device; 22. power supply main board; 221. electronic element.

DETAILED DESCRIPTION

A description of example embodiments follows.

Hereinafter the technical solution in the embodiments of the present application will be described clearly and integrally in combination with the accompanying drawings in the embodiments of the present application, and obviously the described embodiments are merely part of the embodiments, not all of the embodiments. Any other embodiment obtained by those skilled in the art based on the embodiments of the present application without paying any creative labor fall within the protection scope of the present application.

It should be noted that the terms "first," "second" and the like in the description and claims of the present application and in the above-mentioned drawings are used to distinguish between similar objects and are not necessarily used to describe a particular order or precedence. It should be understood that the data so used may be interchanged where appropriate for the purpose of the embodiments of the present application described herein. Furthermore, the terms "comprising" and "having" and any variations thereof are intended to cover non-exclusive inclusions, such as, for example, a process, a method, a system, a product or a device comprising a series of steps or units need not to be limited to those steps or units that are clearly listed, but may include other steps or units that are not explicitly listed or inherent to these processes, methods, products or devices.

In the present application, the orientation or positional relationship indicated by the terms "on", "under", "left", "right", "front", "back", "top", "bottom", "inside", "outside", "middle", "vertical", "horizontal", "transverse", "longitudinal" and the like is based on the orientation or positional relationship shown in the drawings. These terms are mainly intended to better describe the present application and its embodiments and are not intended to limit that the indicated devices, elements or constituents must have a particular orientation, or be constructed and operated in a particular orientation.

The positional relationship such as "parallel" or "vertical" includes not only the positional relationship of exactly "parallel" or "vertical," but also the positional relationship that the angle deviation relative to exactly "parallel" or "vertical" is within the preset deviation range.

Also, in addition to being used to represent an orientation or positional relationship, some of the above terms may also be used to indicate other meanings. For example, the term "on" may also be used in some cases to denote a certain attachment or connection. The specific meanings of these terms in the present application may be understood by those ordinarily skilled in the art as the case may be.

In addition, the terms "installation", "setting", "being provided with", "connecting", "connected", "sleeving" should be understood broadly. For example, the connection may be a fixed connection, a detachable connection or an integrated construction, or may be a mechanical connection or an electrical connection, or may be a direct connection, or may be an indirect connection through an intermediary, or an internal communication between two devices, elements or constituents. The specific meanings of the above terms in the present application may be understood by those ordinarily skilled in the art as the case may be.

It should be noted that the embodiments in the present application and the features in the embodiments can be combined with each other without conflict. Hereinafter, the present application will be described in detail with reference to the drawings and in connection with embodiments.

Figure 2:
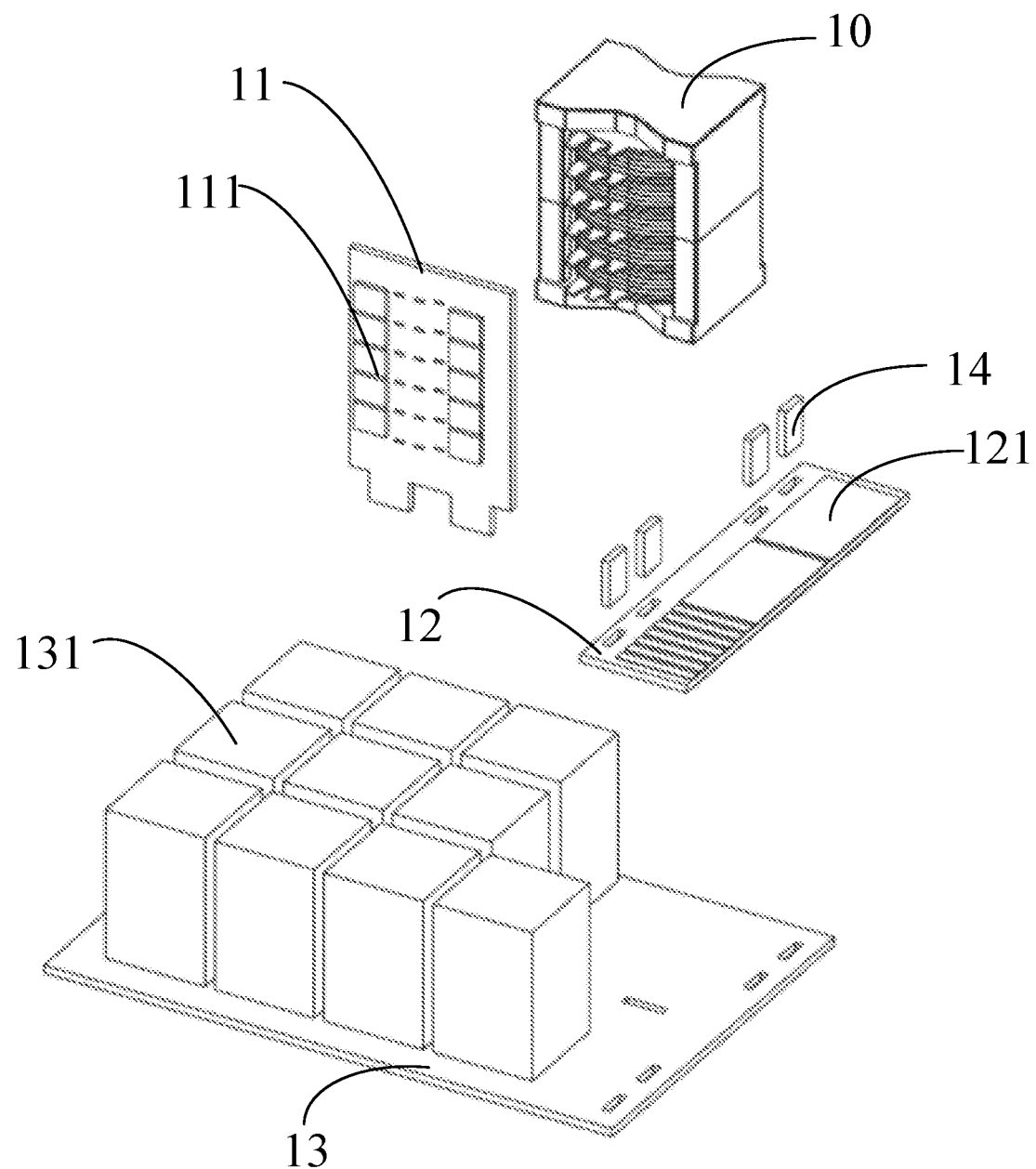
FIG. 2 shows an exploded view of a synchronous rectification assembly in the prior art.

As shown in FIGS. 1 and 2, in the prior art, the transformer 10 of the power supply of the external apparatus is electrically connected to the synchronous rectification board 11, and is disposed on the power supply main board 13 together with the synchronous rectification board 11, wherein the synchronous rectification board 11 is further provided with a plurality of switching devices 111. The synchronous rectification board 11 is electrically connected to the power supply main board 13, so that the signals on the synchronous rectification board 11 can be transmitted to the power supply main board 13. The power supply main board 13 is further provided with a plurality of electronic elements 131 such as chips. The golden finger board 12 for being electrically connected to the external apparatus is provided with a conductive contact 121 that can transmit an output signal on the golden finger board 12 to the external apparatus when the golden finger board 12 is electrically connected to the external apparatus. The golden finger board 12 is further electrically connected to the power supply main board 13 through the connection piece 14. Thus, in the prior art, the output signal outputted from the transformer 10 is rectified by the synchronous rectification board 11, and then transmitted to the power supply main board 13, and then transmitted to the golden finger board 12 through the power supply main board 13, and transmitted to the external apparatus through the conductive contact 121 on the golden finger board 12, so that the path of the processed output signal outputted from the synchronous rectification board 11 is relatively long, which causes a relatively large loss. In addition, it is necessary to provide three circuit boards including the synchronous rectify board 11, the golden finger board 12 and the power supply main board, the number of required circuit boards is large, and the connection between the circuit boards needs to be complex, the process is difficult, and the installation needs many steps, thus the cost of the synchronous rectification assembly is high.

Figure 3:
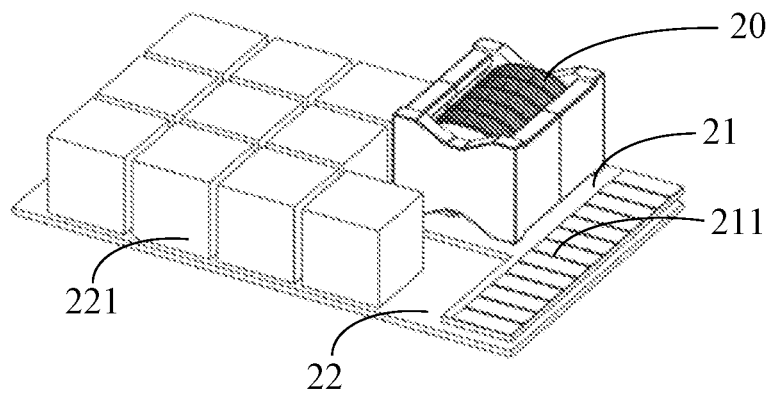
FIG. 3 shows a schematic diagram of a synchronous rectification assembly according to a specific embodiment of the present application.
Figure 4:
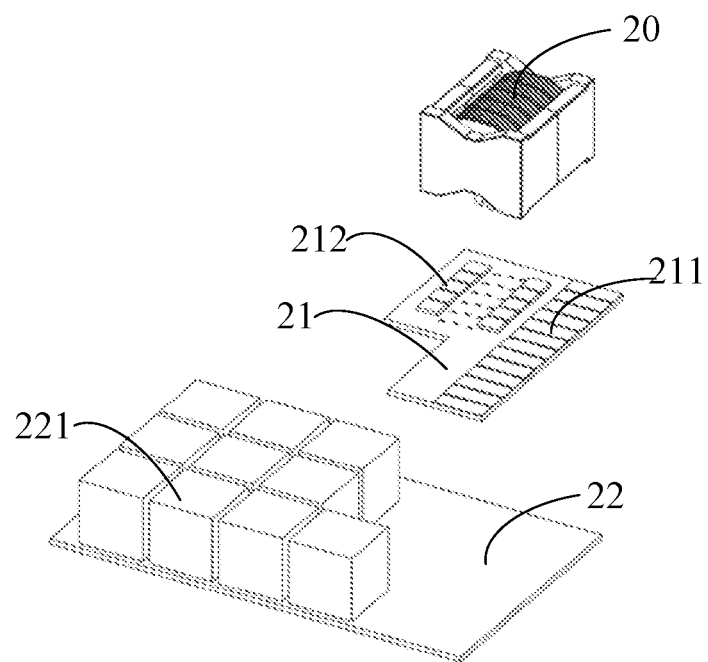
FIG. 4 shows an exploded view of a synchronous rectification assembly according to a specific embodiment of the present application.

Based on the above defects existing in the prior art, according to an aspect of the present application, the present embodiment discloses a synchronous rectification assembly. As shown in FIGS. 3 and 4, the synchronous rectification assembly comprises a synchronous rectification board 21, a transformer 20 and a main board.

Wherein the synchronous rectification board 21 is disposed on the main board and is electrically connected to the main board, and the transformer 20 is disposed on the synchronous rectification board 21 and is electrically connected to the synchronous rectification board 21.

The synchronous rectification board 21 is provided with a conductive contact 211 for being electrically connected to an external apparatus, and the synchronous rectification board 21 is used for synchronously rectifying an output signal of the transformer 20 and thereafter transmitting the output signal to the conductive contact 211.

In the synchronous rectification assembly of the present application, the transformer 20 is provided on the synchronous rectification board 21, and the synchronous rectification board 21 is provided on the power supply main board 22. Wherein the synchronous rectification board 21 is provided with a conductive contact 211 for being electrically connected to an external apparatus. Moreover, the synchronous rectification board 21 may further perform synchronous rectification on the output signal output by the transformer 20, and transmit the synchronously rectified signal to the external apparatus through the conductive contact 211 on the synchronous rectification board 21. Thus, the output signal output by the transformer 20 in the present application is rectified by the synchronous rectification board 21 and then directly transmitted through the synchronous rectification board 21 to the conductive contact 211 thereon. That is, the output signal of the transformer 20 can be output to the external apparatus only through the processing and transmission of the synchronous rectification board 21, and does not need to be transmitted to the conductive contact 211 on the golden finger board through the power supply main board 22. Therefore in the present application, the output signal outputted by the transformer 20 is transmitted to the conductive contact 211 in a shorter transmission path, which greatly shortens the transmission path of the output signal with large current and effectively reduces the energy loss of the output signal in the transmission process. Furthermore, in the synchronous rectification assembly of the present application, the conductive contact 211 is provided on the synchronous rectification board 21, so that it is unnecessary to separately provide the golden finger board, and the number of circuit board adopted in the present application is less, the cost and structural complexity of the synchronous rectification assembly can be reduced, the process difficulty and the installation steps can be reduced.

It should be noted that, in this embodiment, the main board is a power supply main board 22, and the power supply main board 22 is provided with a plurality of electronic elements 221, which can be used in a power supply of an external apparatus.

In an alternative embodiment, a plurality of switching devices 212 are provided on the synchronous rectification board 21. More alternatively, in order to further reduce the size of the synchronous rectification board 21, switching devices 212 may be provided on both upper and lower surfaces of the synchronous rectification board 21.

In an alternative embodiment, the outer edge of the synchronous rectification board 21 is located inside the outer edge of the power supply main board 22.

It can be understood that the outer edge of the synchronous rectification board 21 is located inside the outer edge of the power supply main board 22, then the size of the synchronous rectification board 21 is smaller than the power supply main board 22, and the coverage of the synchronous rectification board 21 in the horizontal direction is within the coverage of the power supply main board 22, then after the synchronous rectification board 21 and the golden finger board are integrated and combined into one PCB board, the space occupation in the horizontal direction is not increased, and the structure of the synchronous rectification assembly is simpler, more compact, and the occupied volume is smaller.

In an alternative embodiment, the transformer 20 comprises a primary side assembly and a secondary side assembly, the secondary side assembly includes a plurality of secondary side windings, and the plurality of secondary side windings are electrically connected to the synchronous rectification board 21.

It can be understood that the power supply voltage of the external apparatus is low, it is necessary to perform voltage conversion on a high-voltage power supply signal via the transformer 20 and to obtain a low-voltage direct current signal after a series of processing, such as rectification processing, etc., and thereafter the direct current signal is transmitted to the external apparatus through the electrical connection piece and the synchronous rectification board 21 to supply power to the external apparatus. In an alternative embodiment, the transformer 20 is an LLC (resonant circuit) transformer 20, a resonant circuit may be provided on the main board, and the primary side assembly of the transformer 20 is electrically connected to the resonant circuit.

In this embodiment, the transformer 20 comprises a primary side assembly and a secondary side assembly, wherein the secondary side assembly includes a plurality of secondary side windings, the primary side assembly can be connected to an external circuit (such as a resonant circuit on the main board) to receive a high-voltage power supply signal of the external circuit, the secondary side assembly is electrically connected to the synchronous rectification board 21, and the secondary side assembly of the transformer 20 outputs a transformed output signal to the synchronous rectification board 21. Wherein the secondary side assembly is a low voltage output side, and alternatively the voltage of the output signal is less than 20V.

In an alternative embodiment, the primary side assembly includes a plurality of primary side windings disposed on a magnetic core of the transformer 20, and the plurality of secondary side windings are also disposed on the magnetic core.

In an alternative embodiment, the primary side winding and the secondary side winding are in plural, the primary side winding and the secondary side winding are arranged alternately to reduce leakage inductance and AC loss of the windings. Alternatively, the number of the secondary side windings is at least 3. In other embodiments, the primary side assembly and the secondary side assembly of the transformer 20 can also adopt other structures as long as the function of the transformer 20 can be realized, and this is not limited in the present application.

In an alternative embodiment, the secondary side winding is a copper sheet. In other embodiments, the secondary side winding may also be made of other structures or materials, and this is not limited in the present application.

In an alternative embodiment, the pin may be made of a copper material. The secondary side winding made of the copper sheet may be formed integrally with the pin, or may be formed separately and then connected and fixed, and the pin may also be made of other materials, which is not limited in this application.

In an alternative embodiment, the primary side winding has an insulating layer. In other alternative embodiments, an insulating layer may be provided on the secondary side winding, or an insulating layer may be provided on each of the primary side winding and the secondary side winding to achieve insulation between the primary side winding and the secondary side winding.

In an alternative embodiment, each of the secondary side assemblies comprises a pin, and a metal hole corresponding to each of the pins is formed on the synchronous rectification board 21. the pins are in plug-in electrical connection to the corresponding metal holes on the synchronous rectification board 21.

It can be understood that by providing the pins in the secondary side assembly, opening the metal holes in the synchronous rectification board 21, and causing the positions of the metal holes to correspond to the pins of the secondary side assembly, the pins of the secondary side assembly can be correspondingly inserted into the metal holes of the synchronous rectification board 21, and then the pins are electrically connected and fixed to the metal holes by soldering or the like, so as to realize the plug-in electrical connection between the transformer 20 and the synchronous rectification board 21. In this embodiment, the transformer 20 is in plug-in electrical connection to the synchronous rectification board 21, and such connection is simple, has a compact structure and facilitates the miniaturization of the structure.

In an alternative embodiment, the pin of the secondary side assembly of the transformer 20 is inserted into the metal hole on the synchronous rectification board 21 from the lower direction of the transformer 20, to be electrically connected to the metal hole.

It can be understood that, since the conductive contact 211 is disposed on the synchronous rectification board 21, the conductive contact 211 is limited in position to contact and electrically connect with an external apparatus, the position of the synchronous rectification board 21 needs to correspond to the height of the conductive contact 211 to be able to be disposed on the synchronous rectification board 21. Thus, the synchronous rectification board 21 can be disposed above the power supply main board 22, the transformer 20 can be disposed above the synchronous rectification board 21, so that the pin of the secondary side assembly of the transformer 20 can be led out from below the transformer 20, then the pin extending from the lower side of the transformer 20 can be directly inserted into corresponding metal holes of the synchronous rectification board 21 and electrically connected to the synchronous rectification board 21. Such a way that the pin of the secondary side assembly of the transformer 20 is directly down-pin can shorten the transmission path in which the output signal of the transformer 20 is transmitted to the synchronous rectification board 21, to reduce the loss.

In an alternative embodiment, the secondary side winding includes a center tap. That is, the secondary side winding includes three pins. Among the three pins, the pin leading out from the middle of the secondary side winding is the center tap, and the other two pins are connected respectively to both ends of the secondary side winding, and the center tap is provided in the secondary side winding, so as to meet different transformation requirements.

In an alternative embodiment, the synchronous rectification board 21 is arranged parallel to the power supply main board 22. Of course, in other embodiments, the synchronous rectification board 21 and the power supply main board 22 may adopt other positional relationships, which is not limited in this application.

In conclusion, in the synchronous rectification assembly provided in the embodiment of the present application, the output signal outputted from the transformer 20 is transmitted to the synchronous rectification board 21, and is rectified on the synchronous rectification board 21 and then directly transmitted to the conductive contact 211, the output signal outputted by the transformer 20 is transmitted to the conductive contact 211 in a shorter path, which greatly shortens the transmission path of the output signal with large current and effectively reduces the energy loss of the output signal in the transmission process. Furthermore, in the synchronous rectification assembly of the present application, the conductive contact 211 is provided on the synchronous rectification board 21, so that it is unnecessary to separately provide the golden finger board, and the number of circuit board adopted in the present application is less, the cost and structural complexity of the synchronous rectification assembly can be reduced, the process difficulty and the installation steps can be reduced.

Based on the same principle, this embodiment further discloses a manufacturing method of a synchronous rectification assembly. The method comprising:

S100: providing a transformer 20 on a synchronous rectification board 21 and electrically connecting the transformer 20 to the synchronous rectification board 21, wherein the synchronous rectification board 21 is provided with a conductive contact 211 for being electrically connected to an external apparatus, and the synchronous rectification board 21 is used for synchronously rectifying an output signal of the transformer 20 and thereafter transmitting the output signal to the conductive contact 211;

S200: providing the synchronous rectification board 21 on the main board and electrically connecting the synchronous rectification board 21 to the main board.

Since the method solves the problem in accordance with the principle similar to the synchronous rectification assembly described above, the implementation of the method may be found by referring to the implementation of the synchronous rectification assembly, and is not repeated herein.

Based on the same principle, this embodiment further discloses a power supply. The power supply includes a synchronous rectification assembly as described in this embodiment.

Since the power supply solves the problem in accordance with the principle similar to the synchronous rectification assembly described above, the implementation of the power supply may be found by referring to the implementation of the synchronous rectification assembly, and is not repeated herein.

The various embodiments in the specification are described in a progressive manner, and the same or similar parts between the various embodiments may be referred to each other, and each embodiment focuses on the differences from the other embodiments. In particular, the system embodiment is simply described since it is substantially similar to the method embodiment, and please refer to the description of the method embodiment for the relevant content.

The teachings of all patents, published applications and references cited herein are incorporated by reference in their entirety.

The above descriptions are only embodiments of the present application and are not intended to limit the application. Various changes and modifications can be made to the present application by those skilled in the art. Any modifications, equivalents, improvements, etc. made within the spirit and scope of the present application are intended to be included within the scope of the claims of the present application.

What is claimed is:

1. A synchronous rectification assembly, characterized in comprising a synchronous rectification board, a transformer and a main board;
    wherein the synchronous rectification board is disposed on the main board and is electrically connected to the main board, and the transformer is disposed on the synchronous rectification board and is electrically connected to the synchronous rectification board;
    the synchronous rectification board is provided with a conductive contact for being electrically connected to an external apparatus, and the synchronous rectification board is used for synchronously rectifying an output signal of the transformer and thereafter transmitting the output signal to the conductive contact;
    wherein the synchronous rectification board is disposed above the main board, the transformer is disposed above the synchronous rectification board, a pin of a secondary side assembly of the transformer is led out from below the transformer, the pin extending from a lower side of the transformer is directly inserted into corresponding metal holes of the synchronous rectification board and electrically connected to the synchronous rectification board.

2. The synchronous rectification assembly according to claim 1, characterized in that, the transformer comprises a primary side assembly and the secondary side assembly, the secondary side assembly includes a plurality of secondary side windings, and the plurality of secondary side windings are electrically connected to the synchronous rectification board.

3. The synchronous rectification assembly according to claim 1, characterized in that, each of a plurality of secondary side assemblies comprises a respective pin, and a metal hole corresponding to each of the respective pins is formed on the synchronous rectification board;
    the respective pins are in plug-in electrical connection to the corresponding metal holes on the synchronous rectification board.

4. The synchronous rectification assembly according to claim 2, characterized in that, a secondary side winding of the plurality of secondary side windings includes a center tap.

5. The synchronous rectification assembly according to claim 1, characterized in that, a primary side winding and a secondary side winding are in plural, and the primary side winding and the secondary side winding are arranged alternately.

6. The synchronous rectification assembly according to claim 2, characterized in that, a number of a primary side winding and a secondary side winding is more than three.

7. The synchronous rectification assembly according to claim 2, characterized in that, the main board is provided with a resonant circuit, and the primary side assembly of the transformer is electrically connected to the resonant circuit.

8. The synchronous rectification assembly according to claim 1, characterized in that, the synchronous rectification board is provided with a switching device.

9. The synchronous rectification assembly according to claim 1, characterized in that, the synchronous rectification board is arranged in parallel to the main board.

10. The synchronous rectification assembly according to claim 1, characterized in that, the main board is a power supply main board.

11. A power supply, characterized in comprising a synchronous rectification assembly according to claim 1.

12. A manufacturing method of a synchronous rectification assembly, characterized in comprising the following steps of:
    providing a transformer on a synchronous rectification board and electrically connecting the transformer to the synchronous rectification board, wherein the synchronous rectification board is provided with a conductive contact for being electrically connected to an external apparatus, and the synchronous rectification board is used for synchronously rectifying an output signal of the transformer and thereafter transmitting the output signal to the conductive contact;
    providing the synchronous rectification board on the main board and electrically connecting the synchronous rectification board to the main board;
    wherein the synchronous rectification board is disposed above the main board, the transformer is disposed above the synchronous rectification board, a pin of a secondary side assembly of the transformer is led out from below the transformer, the pin extending from a lower side of the transformer is directly inserted into corresponding metal holes of the synchronous rectification board and electrically connected to the synchronous rectification board.

* * * * *

UNITED STATES PATENT AND TRADEMARK OFFICE
CERTIFICATE OF CORRECTION

PATENT NO. : 12,476,554 B2  
APPLICATION NO. : 18/060423  
DATED : November 18, 2025  
INVENTOR(S) : Yuetian Wang Page 1 of 1

It is certified that error appears in the above-identified patent and that said Letters Patent is hereby corrected as shown below:

On the Title Page

Item (71) should read: Delta Electronics (shanghai) Co., Ltd.

Item (73) should read: Delta Electronics (shanghai) Co., Ltd.

Signed and Sealed this  
Twenty-seventh Day of January, 2026

John A. Squires  
*Director of the United States Patent and Trademark Office*